United States Patent [19]

Inoue

[11] 4,425,197

[45] Jan. 10, 1984

[54] METHOD OF AND APPARATUS FOR ELECTRODEPOSITING A METAL ON A CONDUCTIVE SURFACE

[75] Inventor: Kiyoshi Inoue, Tokyo, Japan

[73] Assignee: Inoue-Japax Research Incorporated, Yokohama, Japan

[21] Appl. No.: 409,130

[22] Filed: Aug. 18, 1982

[30] Foreign Application Priority Data

Aug. 19, 1981 [JP] Japan ............................ 56-128805
Jun. 28, 1982 [JP] Japan ............................ 57-110033

[51] Int. Cl.$^3$ ........................ C25D 5/04; C25D 7/04; C25D 17/00
[52] U.S. Cl. .................................. 204/25; 204/26; 204/278
[58] Field of Search ............... 204/23, 25, 26, 14 R, 204/278

[56] References Cited

U.S. PATENT DOCUMENTS

| | | | |
|---|---|---|---|
| 1,731,456 | 10/1929 | Eaton | 204/278 |
| 1,738,727 | 12/1929 | Pike | 204/278 |
| 4,139,446 | 2/1979 | Suslin | 204/278 |
| 4,269,672 | 5/1981 | Inoue | 204/25 |
| 4,364,802 | 12/1982 | Inoue | 204/23 |

FOREIGN PATENT DOCUMENTS 2052562 1/1981 United Kingdom .

Primary Examiner—T. M. Tufariello
Attorney, Agent, or Firm—Karl F. Ross; Herbert Dubno

[57] ABSTRACT

An electrodepositing method and apparatus utilizing a substantially hermetically sealed receptacle for accommodating a workpiece therein. An electrodepositing solution is flooded into the region of a gap between an anode and a cathodic conductive surface on the workpiece to allow the electrodepositing current of a high current density from a power supply to be delivered in the gap to electrodeposit a metal from the solution at least predominantly on a limited area on the workpiece surface juxtaposed with an active electrode face of the anode while permitting gases to be electrolytically produced in the gap and to be collected together with mists of the solution in a sealed room or space in the receptacle. The anode and the workpiece are relatively displaced to allow the active electrode face to sweep in a scanning manner over the workpiece surface to maximize the efficiency and performance of electrodeposition. A suction pump is provided to withdraw, under suction, the gaseous effluent accumulated in the space from the receptacle into an outlet duct.

19 Claims, 3 Drawing Figures

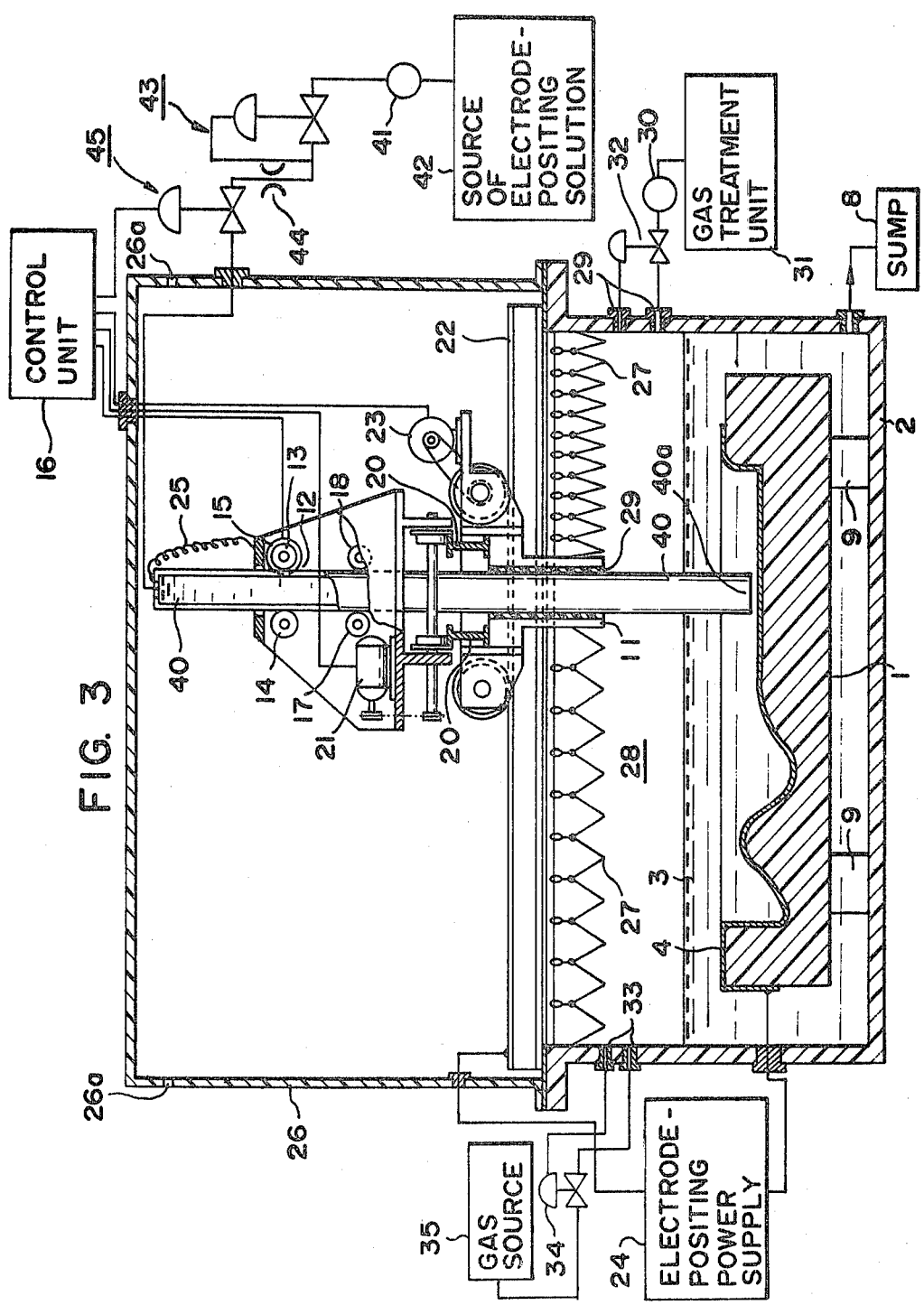

METHOD OF AND APPARATUS FOR ELECTRODEPOSITING A METAL ON A CONDUCTIVE SURFACE

FIELD OF THE INVENTION

The present invention relates to electrodeposition and, more particularly, to a new and improved method of and apparatus for forming a layer of (electrodeposit) of a metal, e.g. copper, nickel, chromium or gold, on an electrically conductive surface such as on an electrically conductive substrate or on a thin metallized film preformed on an electrically nonconductive article or mold. Such a substrate, article or mold is herein referred to generally as "workpiece".

BACKGROUND OF THE INVENTION

Electrodeposition has been widely used for coating an article with a layer of electrodeposit and for electroforming an article such as a die or electrical machining (e.g. EDM) tool electrode. In electroforming, a desired metal is electrodeposited on a mold which is typically of a metallized electrically nonconductive substance and the electrodeposit is permitted to build up to a substantial thickness for subsequent removal from the mold to serve as the desired article. The deposit receiving article i.e. mold, or the "workpiece" is often large and intricate in shape or uneven (macroscopically), necessarily presenting one or more recessed areas. It is desirable that a coating or electroform be of a uniform thickness or of a desired thickness distribution over the entire area of such an intricate or uneven contour. Moreover it is often desirable that the metal deposit be thinner in projecting areas and thicker in recessed areas; however, such requirements are generally opposed to the intrinsic tendency of electrodeposition. Thus, the electrodeposit tends to be thicker in projecting areas, e.g. on ridges or convex angular portions, and to be thinner in recessed areas. In a recess, the electrodeposit tends to concentrate on the opening corner portion thereof with very little or even practically no deposit likely to occur on the floor and the corner edge portion thereof when a conventional electrodeposition arrangement is used in which the workpiece is immersed in a static mass of the electrodepositing solution and spaced with a simple planar electrode across a wide distance therein. An electrodepositing current can then be delivered only with a low current density.

On the other hand, it is known that the electrodepositing current density can be increased when the solution furnishing the depositable metal is forced to flow or floods the region of the electrode and the workpiece. While the measure to use an electrode which is shaped complementarily with the workpiece contour and to arrange such an electrode in close juxtaposition with the workpiece surface has been found to serve to increase the density of the electrodepositing current that can be delivered, and hence to increase the rate of electrodeposition, this measure has also been found to be generally unsatisfactory to drastically improve the uniformity of electrodeposit over the contoured surface apparently because the desired uniformity of distribution of the flooding solution over the entire surface is not necessarily achieved. Furthermore, this measure is totally inapplicable when selective or localized electrodeposition is contemplated.

I have found that a desired layer of electrodeposit of substantial and uniform thickness can be obtained most effectively and efficiently by employing a simple electrode having an active electrode surface much narrower than the workpiece surface to be electrodeposited and displacing the electrode relative to the workpiece to cause the active electrode surface to sweep in a scanning manner over the workpiece surface while maintaining the small gap between the electrode and the workpiece to be flooded with the electrodepositing solution, thus permitting the high-density electrodepositing current to be maintained through the gap. In this manner, an uneven and large or intricate surface having one or more recesses can be thoroughly electrodeposited, yet in a time period substantially shortened with the conventional method. Selective or localized electrodeposition and forming a layer of electrodeposit with a controlled thickness distribution can be achieved by controlling the magnitude of the electrodepositing current and/or the rate of flow of the depositing solution.

While it has been found that extremely high-speed electrodeposition can thus be obtained practically on any electrodepositable surface by maintaining a dynamic flow of the electrodepositing solution, it has now been recognized also that a problem arises as a result of the achieved improvement in the depositing efficiency and performance. Thus, the electrodepositing gap becomes a source of extremely high-rate generation of pollutants to the environment and essential equipment or parts of the apparatus. Gases are electrolytically produced from the electrodepositing gap and, together with mists, become gaseous effluents rising from the flooding solution which are harmful not only to the operator but to the environment and the sensitive elements of the apparatus. Not only are these effluents detrimental or hazardous to the operators, but such effluents, if allowed to be emitted for a prolonged time period, can cause corrosion or malfunctioning of the equipment.

OBJECTS OF THE INVENTION

It is accordingly an important object of the present invention to provide a novel and improved method of and apparatus for electrodepositing a metal upon an electrically conductive surface whereby the desired layer of electrodeposit can be achieved at an extremely high rate and with uniformity or a desired thickness or pattern distribution without polluting the environment and malfunctioning the equipments.

Another important object of the invention is to provide a novel and improved electrodepositing apparatus which is relatively compact and which assures the high-rate and high-precision or high-performance formation of a layer of electrodeposit on an electrically conductive surface and effectively prevents the environment from becoming polluted and the equipment from malfunctioning.

SUMMARY OF THE INVENTION

In accordance with the present invention there is provided, in a first aspect thereof, a method of electrodepositing a metal upon an electrically conductive surface, which method comprises the steps of: (a) accommodating, in an essentially hermetically sealed receptacle, a workpiece having the surface to be electrodeposited; (b) positioning electrode means in spaced juxtaposition with the workpiece in the receptacle; (c) flooding an electrodepositing solution at least into the region of a gap between the electrode means and the workpiece within the receptacle; (d) passing an electrodepositing current between the electrode means and the workpiece to electrodeposit the metal from the solution at least predominantly on a limited area of the workpiece surface juxtaposed with the electrode means while permitting gases to be electrolytically produced from said gap and, possibly together with mists of the solution, to result in a gaseous effluent and permitting the gaseous effluent to be collected in a room or space within the receptacle; (e) relatively displacing the workpiece and the electrode means to sweep the limited area of at least predominant electrodeposition progressively over the workpiece surface; and (f) withdrawing the gaseous effluent collected in the room from the receptacle.

The gaseous effluent being collected in the space is withdrawn from the receptacle into a space outside by applying a difference in pressure, i.e. suction, between the room and the space outside. The receptacle may be formed with one or more ventilators so that the difference in pressure allow fresh atmospheric air to be introduced into the receptacle. Alternatively, the receptacle may be air-tightly closed. An innocuous or harmless gas such as air, nitrogen or argon may be pumped into the room from a source of the gas. In this case, the pressure in the room is held at a superatmospheric level, preferably between 2 and 5 atms. Alternatively, the pressure may be held at a subatmospheric level. The gaseous effluent withdrawn outside the receptacle is preferably separated into mists and gases which may then be treated by means of a conventional gas treatment unit.

The invention also provides, in a second aspect thereof, an electrodepositing apparatus which comprises: (a) a substantially hermetically sealed receptacle for accommodating therein a workpiece having an electrically conductive surface to be electrodeposited; (b) means for supporting the workpiece in the receptacle; (c) means for supporting electrode means in spaced juxtaposition with the workpiece in the receptacle; (d) means for flooding an electrodepositing solution at least in the region of a gap between the electrode means and the workpiece within the receptacle; (e) power supply means for passing an electrodepositing current between the electrode means and the workpiece to electrodeposit a metal from the solution at least predominantly on a limited area of the workpiece surface juxtaposed with the electrode means while permitting gases to be electrolytically produced in the gap and, possibly together with mists of the solution, to be collected as a gaseous effluent in a room or space within the receptacle; (f) drive means for relatively displacing the workpiece and the electrode means to sweep the limited area of at least predominant electrodeposition progressively over the workpiece surface; and (g) suction means for drawing the gaseous effluent being collected in the said room from the receptacle.

Specifically, the receptacle is formed with ventilator means for communicating the room with the atmosphere to permit fresh atmospheric air to be introduced into the said room under the suction withdrawing the gaseous effluent from the receptacle. Alternatively, the receptacle is constructed so as to be essentially air-tight and a harmless gas such as air, nitrogen or argon is pumped into the said room to hold the pressure within the room at a predetermined level, preferably superatmospheric, say, from 2 to 5 atms, or at a subatmospheric level.

BRIEF DESCRIPTION OF THE DRAWING

These and other features of the present invention as well as advantages thereof will become more readily apparent from the following description of certain embodiments thereof when taken with reference to the accompanying drawing in which:

FIG. 3 is a diagrammatic view, similar to FIG. 1, illustrating a modified electrodepositing apparatus according to the present invention.

SPECIFIC DESCRIPTION

Figure 1:
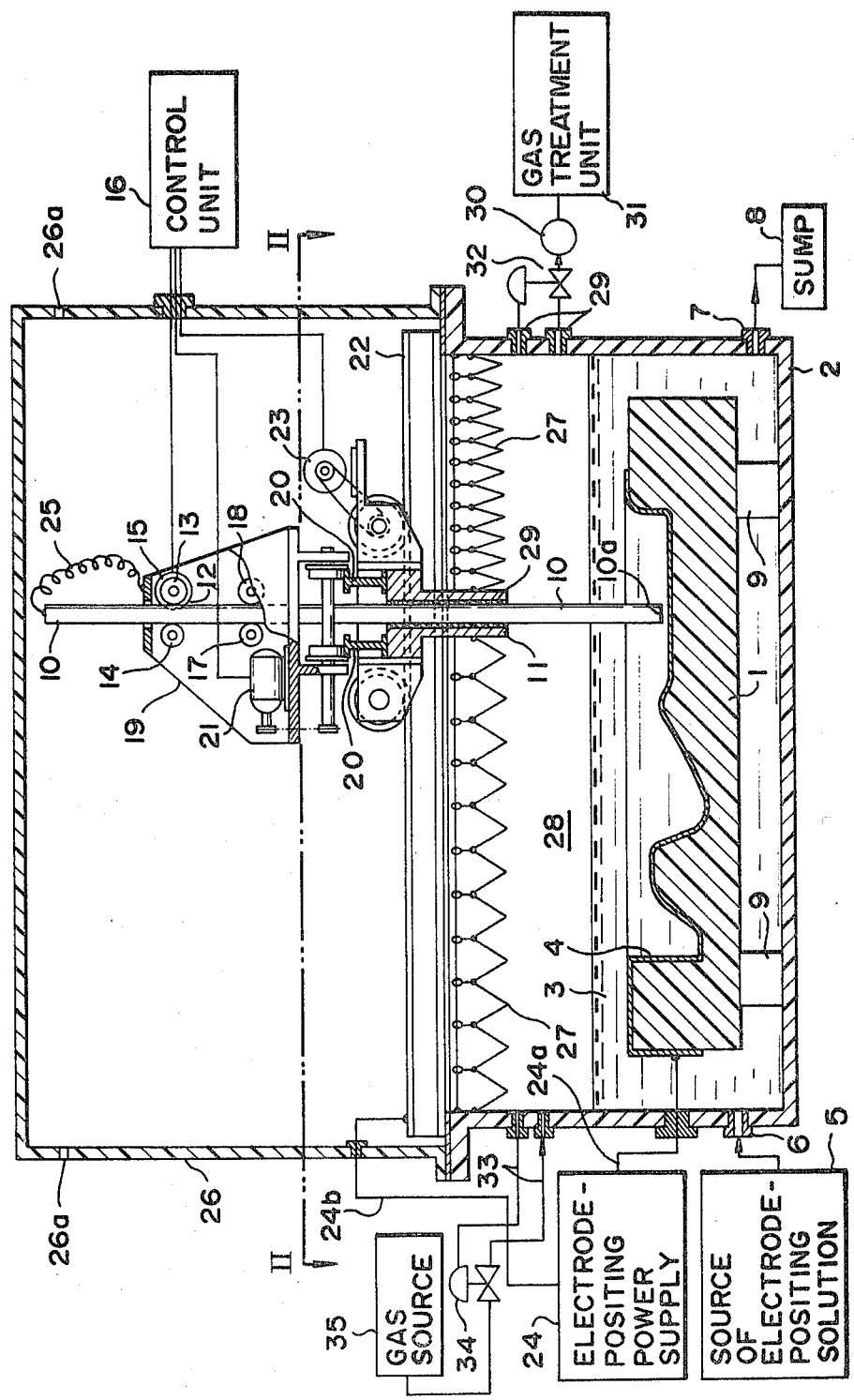
FIG. 1 is a diagrammatic view, partly in section and partly in a block diagram form, illustrating an electrodepositing apparatus according to the present invention.

Referring to FIG. 1, an electroforming mold 1 composed, say, of a plastic is shown securely accommodated in an electrically nonconductive worktank 2 in an electrodepositing solution 3 contained therein. The mold 1 has a thin metallic coating 4 previously applied on a selected surface area thereof, say, by chemical plating to constitute a conductive electroforming substrate or workpiece. The solution 3 is supplied continuously or intermittently from a source 5 through a pipe 6 into the worktank 2 and, flooding over the surface 4, is allowed to flow out via an outlet 7 into a pump 8. The mold 1 is positioned in the worktank 2 by means of stands 9.

Positioned in closely spaced juxtaposition with the conductive surface 4 of the mold 1 is an anodic elongate electrode 10 which is movable vertically, i.e. in the direction of a Z-axis. The electrode 10 is moved through a sleeve member 11 by a drive 12 comprising a capstan 13 and a pinch roller 14. A motor 15 for the capstan 13 is driven with a signal from a control unit 16 to establish the position of an electrode surface 10a constituted by the lower end surface of the electrode 10. A pair of rollers 17 and 18 are provided to further guide the elongate electrode 10 moving vertically. The drive assembly 12 and the rollers 17 and 18 are secured to a carriage 19 which is wheeled to roll on a pair of parallel rails 20 for movement in the direction of an X-axis by a motor 21. Each of the rails 20 extending in the X-axis direction is securely mounted on the sleeve member 11 which is wheeled to run over a pair of parallel rails 22 for movement in the direction of a Y-axis by a motor 23. The motors 15, 21 and 23 are energized with drive signals from the control unit 16 to displace the electrode 10 so that its active electrode face 10a moves in a scanning manner over the contoured surface 4 along a preprogrammed path in the X, Y and Z coordinate system. The narrow gap distance between the active electrode face 10a is held substantially constant.

An electrodepositing power supply 24 has one terminal electrically connected to the conductive layer 4 and the other terminal electrically connected via the rails 22, the sleeve member 11, the rails 20, the carriage 19 and a conductor 25 to the anodic electrode 10. The sleeve member 11, the rails 20 and 22 and the carriage 19 are metallic and electrically conductive.

The drive assembly comprising elements 11 through 23 inclusive is accommodated in a covering 26 formed with ventilators 26a and mounted on the worktank 2. Furthermore, the drive assembly is isolated from the electrodepositing tank 2 by a pleated expansible or accordion-pleated partition 27 which is secured to the wall (top end) of the worktank 2 and has an elongated rectangular opening 27a (FIG. 2) for accepting the sleeve member 11 which guides the elongate anode 10. The partition 27 is pleated in the direction of the Y-axis and allows movement of the anode 10 in this direction. The opening 27a is fitted with a deformable split fitting 27b through which to slidably accept the electrode 10 so that the electrode 10 may move in the direction of the x-axis. The fitting 27b may be a split sponge-like member capable of essentially hermetically sealing the space defined by the surface of the electrodepositing solution 3, the wall of the worktank 2 and the partition 27.

With the arrangement described, a high-rate and high-performance electrodepositing operation is carried out on the conductive surface 4 which may be intricate or uneven (macroscopically) as shown. With the anode 10 and the conductive surface 4 energized, electrodeposit of the metal builds up quickly on the localized area on the conductive surface 4 by virtue of the forced flow of the electrodepositing solution 3 in the region between the anode 10 and the conductive surface 4 which are closely spaced apart from one another. As electrodeposition proceeds, the anode 10 is displaced relative to the mold 2 to cause the active electrode face 10a to sweep in a scanning manner over the conductive surface 4, thereby progressively electrodepositing the surface 4 with the metal from the solution 3.

As electrodeposition commences and continues, gases are electrolytically produced in the gap and, upon entraining mists from the solution 3, results in a gaseous effluent which is generally corrosive and harmful, the gaseous effluent collecting in the space defined by the wall of the worktank 2, the surface of the solution 3 therein and the partition 27. In accordance with an important feature of the present invention, a closed room 28, which may be served by this space, is provided communicating via a conduit 29 to a suction pump 30 to withdraw the gaseous effluent. Closing the room 28 with the partition effectively prevents the gaseous effluent from being brought into contact with elements in the drive assembly 11 through 23. The split fitting 27b in the partition 27 may be constituted by a porous or air-permeable deformable member. Then, fresh atmospheric air is sucked via the ventilators 26a into the room 28 by the pump 30 drawing the gaseous effluent out thereof. The pressure within the room 28 is then held at a subatmospheric level. The gaseous effluent drawn by the pump 30 may be treated by a gas treatment system 31 which separates gases from the liquid or solution 3 and, if necessary, decomposes the gases into monharmful components. The liquid separated from the gases may be treated by a conventional liquid treatment system (not shown) for disposal. A valve system 32 is provided in the conduits 29 to regulate the volume flow of the gaseous effluent drawn from the room 28 by the pump 30.

The split fitting 27b may also be an impervious deformable member. In this case, the room 28 may communicate via conduits 33 and a valve system 34 with a source 35 of air or a like harmless or innocuous, external gas such as argon or nitrogen. The source 35 furnishes the gas into the room 28 being evacuated by the suction pump 30. The gas pressure in the room 28 is regulated by the valve 34 and may be held at a superatomspheric pressure, which is preferably in excess of 2 atms and up to 5 atms. Alternatively, the pressure within the room 28 may be held at a subatmospheric level by regulating the valve system 32 in conjunction with the regulation of the valve system 34.

Figure 2:
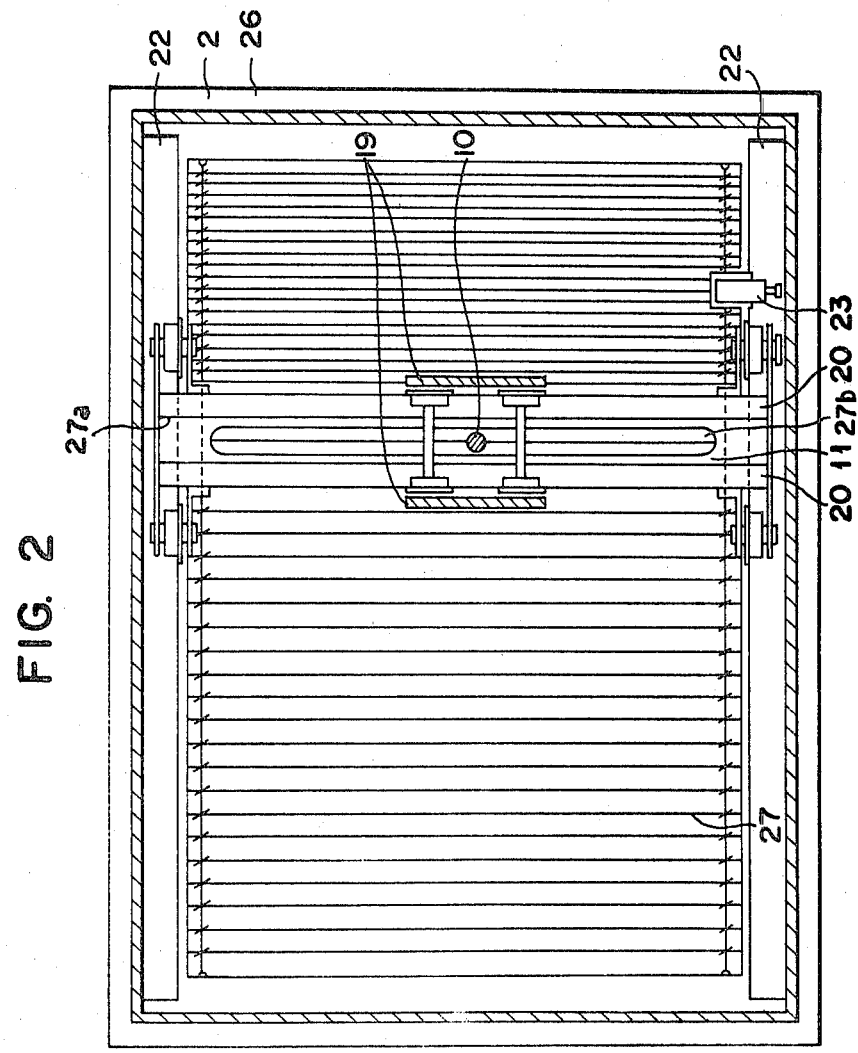
FIG. 2 is a top plan view taken along the line II—II in FIG. 1.

The embodiment of FIG. 3 is substantially the same as that shown in FIGS. 1 and 2 and described except that the electrodepositing solution 3 is supplied in a forced flow through an anodic electrode 40 which is tubular. Thus, the electrodepositing solution is supplied by a pump 41 from a reservoir 42 into the tubular anode 40 via a pressure control valve system 43, a throttle valve 44 and a flow-rate control valve 45 and then into the electrodepositing gap between the anode 40 and the conductive surface 4 through an end opening 40a of the anodic electrode 40. By virtue of provision, in this embodiment as well, of the partition 27, the gaseous effluent drawing system 29 through 32 and the ventilators 26a or the external gas pumping system 33 through 35, the rate of delivery of the electrodepositing solution into the gap between the active electrode face 40a and the conductive surface 4 can be enhanced to a maximum to assure a highest electrodepositing current density and hence a highest rate of electrodeposition without causing pollution to the environment, corrosion of elements in the drive assembly or harzard to the operator's health. The pressure of the electrodepositing solution 3 pumped into the electrodeposing gap is regulated by the valve 43 and should preferably be not less than 5 $kg/cm^2$.

In the embodiment of FIG. 3, the valve system 45 can be controlled in a preprogrammed manner by output signals from the control unit 16. Thus, the delivery volume flow rate of the electrodepositing solution into and through the gap should preferably be controlled as a function of the particular shape of an area on the conductive surface 4 and hence on the mold 2, juxtaposed with the active electrode face 40a. Thus, for a recessed area, the flow rate can be increased. Conversely, for a convex or planar area, the flow rate should or may be minimized. In this manner, the conductive surface 4 can be electrodeposited thoroughly and uniformly or with a desired thickness distribution over the entire area thereof and at an enhanced rate.

What is claimed is:

1. A method of electrodepositing a metal upon an electrically conductive surface, comprising the steps of:
   (a) accommodating, in an essentially hermetically sealed receptacle, a workpiece having a surface to be electrodeposited;
   (b) positioning electrode means in spaced juxtaposition with said surface of said workpiece in said receptacle;
   (c) flooding an electrodepositing solution into at least the region of a gap between said electrode means and the workpiece within said receptacle;
   (d) passing an electrodepositing current between said electrode means and said workpiece to electrodeposit said metal from said solution at least predominantly on a limited area of the workpiece surface juxtaposed with the electrode means while permitting gases to be electrolytically produced from said gap and together with any mist of the solution, to be collected as a gaseous effluent in a space within said receptacle;
   (e) relatively displacing said workpiece and said electrode means by operating drive means disposed outside said receptacle and drivingly connected with at least one of said workpiece and said electrode means so as to cause said limited area of at least predominant electrodeposition to sweep progressively over said workpiece surface within said receptacle;

(f) withdrawing, under suction, said gaseous effluent being collected in said space from said receptacle to the exterior thereof; and (g) introducing fresh atmospheric air into said room under said suction withdrawing said gaseous effluent from said receptacle.

2. A method of electrodepositing a metal upon an electrically conductive surface, comprising the steps of:

(a) accommodating, in an essentially hermetically sealed receptacle, a workpiece having said surface to be electrodeposited;

(b) positioning electrode means in spaced juxtaposition with said surface of said workpiece in said receptacle;

(c) flooding an electrodepositing solution into at least the region of a gap between said electrode means and the workpiece within said receptacle;

(d) passing an electrodepositing current between said electrode means and said workpiece to electrodeposit said metal from said solution at least predominantly on a limited area of the workpiece surface juxtaposed with the electrode means while permitting gases to be electrolytically produced from said gap and any mist of the solution, to be collected as a gaseous effluent in a space within said receptacle;

(e) relatively displacing the workpiece and the electrode means by operating drive means disposed outside said receptacle and drivingly connected with at least one of said workpiece and said electrode means so as to cause said limited area of at least predominant electrodeposition to sweep progressively over said workpiece surface within said receptacle;

(f) withdrawing, under suction, said gaseous effluent being collected in said space from said receptacle to the exterior thereof; and (g) pumping under pressure a harmless gas into said space while gaseous effluent is being withdrawn from said receptacle to the exterior thereof.

3. The method defined in claim 1 or claim 2 wherein said space is held at a subatmospheric pressure.

4. The method defined in claim 2 wherein said space is held at a superatmospheric pressure.

5. The method defined in claim 4 wherein said pressure ranges between 2 and 5 atms.

6. The method defined in claim 2, claim 4 or claim 6 wherein said harmless gas is an inert gas.

7. The method defined in claim 6 wherein said inert gas is at least one gas selected from the group which consists of argon and nitrogen.

8. The method defined in claim 6 wherein said electrode is a tubular electrode having a fluid passage formed therein and an opening at a forward end thereof communicating with said fluid passage and open to said room at least partially with said inert gas, further comprising the step of passing said electrodepositing solution through said fluid passage so as to flood it from said opening into said gap under a pressure not less than 5 kg/cm$^2$.

9. An electrodepositing apparatus, comprising:
a substantially hermetically sealed receptacle for accommodating therein a workpiece having an electrically conductive surface to be electrodeposited;
means for supporting said workpiece in said receptacle;
means for supporting electrode means in spaced juxtaposition with said workpiece in said receptacle;
means for flooding an electrodepositing solution at least in the region of a gap between said electrode means and said workpiece within said receptacle;
power supply means for passing an electrodepositing current between said electrode means and said workpiece to electrodeposit a metal from said solution at least predominantly on a limited area of the workpiece surface juxtaposed with said electrode means while permitting gases to be electrolytically produced from said gap and, possibly together with a mist of said solution, to be collected as a gaseous effluent in a room within said receptacle;
drive means disposed within said receptacle; drivingly connected with at least one of said workpiece and said electrode means for relatively displacing said workpiece and said electrode so as to cause said limited area of at least predominant electrodeposition progressively over said workpiece surface within said receptacle;
suction means connected with said receptacle for withdrawing, under suction, said gaseous effluent being collected in said room from said receptacle into a space outside; and
ventilator means associated with said receptacle for communicating said room within said receptacle with the atmosphere to cause fresh atmospheric air to be introduced into said room under suction withdrawing said gaseous effluent from said receptacle into said space outside.

10. The apparatus defined in claim 9 wherein said ventilator means is adapted, in conjunction with said suction means, to hold the pressure in said room at a subatmospheric level.

11. An electrodepositing apparatus, comprising:
a substantially hermetically sealed receptacle for accommodating therein a workpiece having an electrically conductive surface to be electrodeposited;
means for supporting said workpiece in said receptacle;
means for supporting electrode means in sapced juxtaposition with said workpiece in said receptacle;
means for flooding an electrodepositing solution at least in the region of a gap between said electrode means and said workpiece within said receptacle;
power supply means for passing an electrodepositing current between said electrode means and said workpiece to electrodeposit a metal from said solution at least predominantly on a limited area of the workpiece surface juxtaposed with said electrode means while permitting gases to be electrolytically produced from said gap and, possibly together with a mist of said solution, to be collected as a gaseous effluent in a room within said receptacle;
drive means disposed outside said receptacle and drivingly connected with at least one of said workpiece and said electrode means for relatively displacing said workpiece and said electrode means to cause said limited area of at least predominant electrodeposition progressively over said workpiece surface within said receptacle;
suction means connected with said receptacle for withdrawing, under suction, said gaseous effluent being collected in said room from said receptacle into a space outside; and means disposed outside and connected with said receptacle for pumping a harmless gas into said room under pressure.

12. The apparatus defined in claim 11 wherein said pumping means is adapted, in conjunction with said suction means to hold the pressure in said room at a subatmospheric level.

13. The apparatus defined in claim 11 wherein said pumping means is adapted, in conjunction with said suction means, to hold the pressure in said room at a superatmospheric level.

14. The apparatus defined in claim 11, claim 12 or claim 13 wherein said harmless gas is an inert gas, said pumping means including a source of said inert gas connected with said room through a wall of said receptacle.

15. The apparatus defined in claim 14 wherein said electrode means comprises a tubular electrode having a fluid passage formed therein and having an opening at its forward end thereof communicating with said fluid passage and open to said room filled at least partially with said inert gas from said source, and said flooding means comprises a reservoir disposed outside said receptacle for furnishing said said electrodepositing solution and a further pumping means for drawing said solution from said reservoir and delivering it through said tubular passage to flood it into said gap from said opening under a pressure not less than 5 kg/cm$^2$.

16. The apparatus defined in claim 9 or claim 11 wherein said drive means is isolated from said room in said receptacle by a pleated expansible or accordion-pleated partition means secured to a wall of said receptacle.

17. The apparatus defined in claim 16 wherein said partition means has an elongated opening for accepting a sleeve member which slidably guides said electrode means to allow the latter to move in the direction of a first axis towards and away from said workpiece.

18. The apparatus defined in claim 17 wherein said partition means is pleated in the direction of a second axis of perpendicular to said first axis.

19. The apparatus defined in claim 18 wherein said elongated opening is fitted with a deformable split fitting member through which to slidably accept said electrode means so as to allow the latter to move in the direction of a third axis perpendicular to said first and second axes.

* * * * *